US012772847B2

(12) United States Patent
Chen et al.

(10) Patent No.: US 12,772,847 B2
(45) Date of Patent: Oct. 20, 2026

(54) COOLING FOR BACK SIDE POWER DISTRIBUTION NETWORK

(71) Applicant: International Business Machines Corporation, Armonk, NY (US)

(72) Inventors: Qianwen Chen, Chappaqua, NY (US); Joshua M. Rubin, Albany, NY (US); Ruilong Xie, Niskayuna, NY (US); Tao Li, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 307 days.

(21) Appl. No.: 18/541,669

(22) Filed: Dec. 15, 2023

(65) Prior Publication Data

US 2025/0201667 A1 Jun. 19, 2025

(51) Int. Cl.
*H10W 40/47* (2026.01)
*H10W 20/20* (2026.01)

(52) U.S. Cl.
CPC ........... *H10W 40/47* (2026.01); *H10W 20/20* (2026.01)

(58) Field of Classification Search
CPC ...... H10W 40/47; H10W 40/40; H10W 40/43
See application file for complete search history.

(56) References Cited

U.S. PATENT DOCUMENTS 7,928,563 B2 4/2011 Bakir et al.
8,110,415 B2 2/2012 Knickerbocker et al.
9,666,562 B2 5/2017 Law et al.
9,818,726 B2 11/2017 Chainer et al.
10,566,265 B2 2/2020 Fukuoka et al.
2010/0187683 A1 7/2010 Bakir et al.
2016/0013114 A1 1/2016 Vadhavkar et al.
2017/0133298 A1* 5/2017 Gutala ................. H10W 40/47
2017/0186728 A1* 6/2017 Chainer ................ H10W 90/00
2022/0359369 A1 11/2022 Tsai et al.

FOREIGN PATENT DOCUMENTS

CN 116435274 A 7/2023
KR 101461819 B1 11/2014
WO 2023049132 A1 3/2023
WO 2025/124958 A1 6/2025

OTHER PUBLICATIONS

International Searching Authority, "Notification of Transmittal of the International Search Report and the Written Opinion of the International Searching Authority, or Declaration," Patent Cooperation Treaty, Feb. 26, 2025, 12 pages, International Application No. PCT/ EP2024/084259.

(Continued)

*Primary Examiner* — Errol V Fernandes
(74) *Attorney, Agent, or Firm* — Harrity & Harrity, LLP

(57) ABSTRACT

An electrical device that includes thermal cooling through silicon vias (TSVs) and micro-channels embedded in the carrier wafer for back side power distribution networks (BSPDN). The carrier wafer is at one end of a stacked structure providing the electrical device. At least one active device layer in the stacked structure that is present a level of the electrical device that is separate from a level containing the thermal cooling through silicon vias (TSVs) and micro-channels.

20 Claims, 6 Drawing Sheets

(56) References Cited

OTHER PUBLICATIONS

Shi, B., Srivastava, A., & Bar-Cohen, A. (Jun. 5, 2013). Co-design of micro-fluidic heat sink and thermal through-silicon-vias for cooling of three-dimensional integrated circuit. IET Circuits, Devices & Systems, 7(5), 223-231.
Liu, Y., Schaper, L. W., Burkett, S., Kamto, A., & Jampana, G. (Jan. 12, 2007). Assembly technology for 3-D VLSI chip stacks. In 40th International Symposium on Microelectronics.
Wang, S., Yin, Y., Hu, C., & Rezai, P. (Jun. 7, 2018). 3D integrated circuit cooling with microfluidics. Micromachines, 9 (6), 287.
Park, M., Kim, S., & Kim, S. E. (2013). TSV liquid cooling system for 3D integrated circuits. Journal of the Microelectronics and Packaging Society, 20(3), 1-6.
Oh et al., "High-aspect ratio through-silicon vias for the integration of microfluidic cooling with 3D microsystems", https://www.sciencedirect.com/science/article/abs/pii/S0167931715300228, Jul. 1, 2015, pp. 30-35.
Intellectual Property Office, "Request for the Submission of an Opinion," Aug. 5, 2026, 10 pages, KR Application No. 10-2026-7006402.

* cited by examiner

COOLING FOR BACK SIDE POWER DISTRIBUTION NETWORK

BACKGROUND

The present disclosure relates generally to semiconductor devices, and more particularly to a structure and fabrication method for semiconductor devices including back side power distribution networks and cooling of devices.

A through-silicon via (TSV) or through-chip via is a vertical electrical connection (via) that passes completely through a silicon wafer or die. TSVs are high-performance interconnect techniques used as an alternative to wire-bond and flip chips to create 3D packages and 3D integrated circuits. Compared to alternatives such as package-on-package, 3D packages and 3D integrated circuits are a significant new trend in semiconductor industry. It has tremendous benefits, including higher interconnect speeds and bandwidth, lower power, and smaller package size (miniaturization), as well as enabling new heterogenous integration platform for photonics IC and MEMS et al.

In thermal cooling of 3D package it has been determined that when the through silica via (TSV) and micro-channel structures are on the same substrate there can be a variety of problems. For example, the through silica via (TSV) structures are both electrical connection and thermal cooling, and typically are fabricated with the same processes. Thus, the cooling through silica vias (TSVs) are also well isolated from the silicon substrate, resulting in low heat dissipation efficiency. Additionally, the micro-channels and the TSVs have a space conflict, limiting the package miniaturization.

SUMMARY

In one embodiment, cooling for structures including back side power distribution networks (BSPDN) can be provided using embedded through silicon vias (TSV) and micro channels in the front side of a silicon carrier structure, which is one mechanism by which the above noted difficulties with through silicon vias on the same device substrate may be overcome. More particularly, instead of being integrated into the same substrate that results in a space conflict, the through silicon via and the micro-channel structures provided herein for cooling for back side power distribution networks overcome space conflicts by integrating the through silicon vias and micro-channel on different substrates with active devices, e.g., different material layers.

In one embodiment, an electrical device is provided that includes a top die level including first thermal cooling through silicon vias (TSV) and microchannels, and a second die level including second thermal cooling through silicon vias (TSV) and electrical connection through silicon vias, wherein an active device layer is in a level of the electrical device that is separate from a level containing the first thermal cooling through silicon vias (TSV), the second thermal cooling through silicon vias and the electrical connection through silicon vias (TSV).

In one embodiment, the first die level includes a first semiconductor containing layer having the first thermal cooling through silicon vias (TSV) embedded therein. The first die level also includes metal wiring in a first back end of the line (BEOL) level that is in contact with the first thermal cooling through silicon vias (TSV) that are embedded in the first semiconductor containing layer. The first back end of the line (BEOL) level is positioned between a first active device layer of the at least one active device layer and the first semiconductor containing layer having the first thermal cooling through silicon vias (TSV) present therein. The first active device layer is also present on a first back side interconnect.

In some embodiments, the first die level and the second die level are separated by a fluidic channel level, wherein the electrical connection through silicon vias (TSV) extend through the fluidic channel level to transmit electrical current between the first and second die level. The second die level can include a second semiconductor containing layer having the second thermal cooling through silicon vias (TSV) and the electrical connection through silicon vias (TSV) embedded therein. The second die level includes a second active device layer. The second active device layer is separated from the second semiconductor containing layer by a second back end of the line (BEOL) level. The second thermal cooling through silicon vias (TSV) and the electrical connection through silicon vias (TSV) extend into the second back end of the line (BEOL) level. The second active device layer is present on a second back side interconnect.

In another aspect, an electrical device is provided that includes a fluidic channel level including thermal cooling through silicon vias (TSV) embedded through a semiconductor containing layer, wherein a cap layer for the fluidic channel level includes an opening therethrough to channels containing the thermal cooling through silicon vias (TSV). The electrical device also includes at least one active device layer is in a level of the electrical device that is separate from a level containing the thermal cooling through silicon vias (TSV). This electrical device can further include back end of the line (BEOL) level that is in contact with the thermal cooling through silicon vias (TSV) that are embedded in the semiconductor containing layer. The back end of the line (BEOL) level can be positioned between the at least one active device layer and the semiconductor containing layer having the thermal cooling through silicon vias (TSV) present therein. The at least one active device layer is present on a back side interconnect.

In another aspect, an electrical device is provided that includes thermal cooling through silicon vias (TSV) embedded through a semiconductor containing layer, wherein the semiconductor containing layer is at one end of a stacked structure providing the electrical device. The electrical device may also include at least one active device layer in the stacked structure that is present a level of the electrical device that is separate from a level containing the thermal cooling through silicon vias (TSV). In, this embodiment, the stacked structure does not need well isolation for fluidic channels.

In some embodiments, the thermal cooling through silicon vias (TSV) have a face that is coplanar with a face of the semiconductor containing layer. In some embodiments, the thermal cooling through silicon vias (TSV) have a face that protrudes beyond a face of the semiconductor containing layer.

In some embodiments, the electrical device further includes a back end of the line (BEOL) level that is in contact with the thermal cooling through silicon vias (TSV) that are embedded in the semiconductor containing layer. The back end of the line (BEOL) level is positioned between the at least one active device layer and the semiconductor containing layer having the thermal cooling through silicon vias (TSV) present therein. The at least one active device layer can be present on a back side interconnect.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
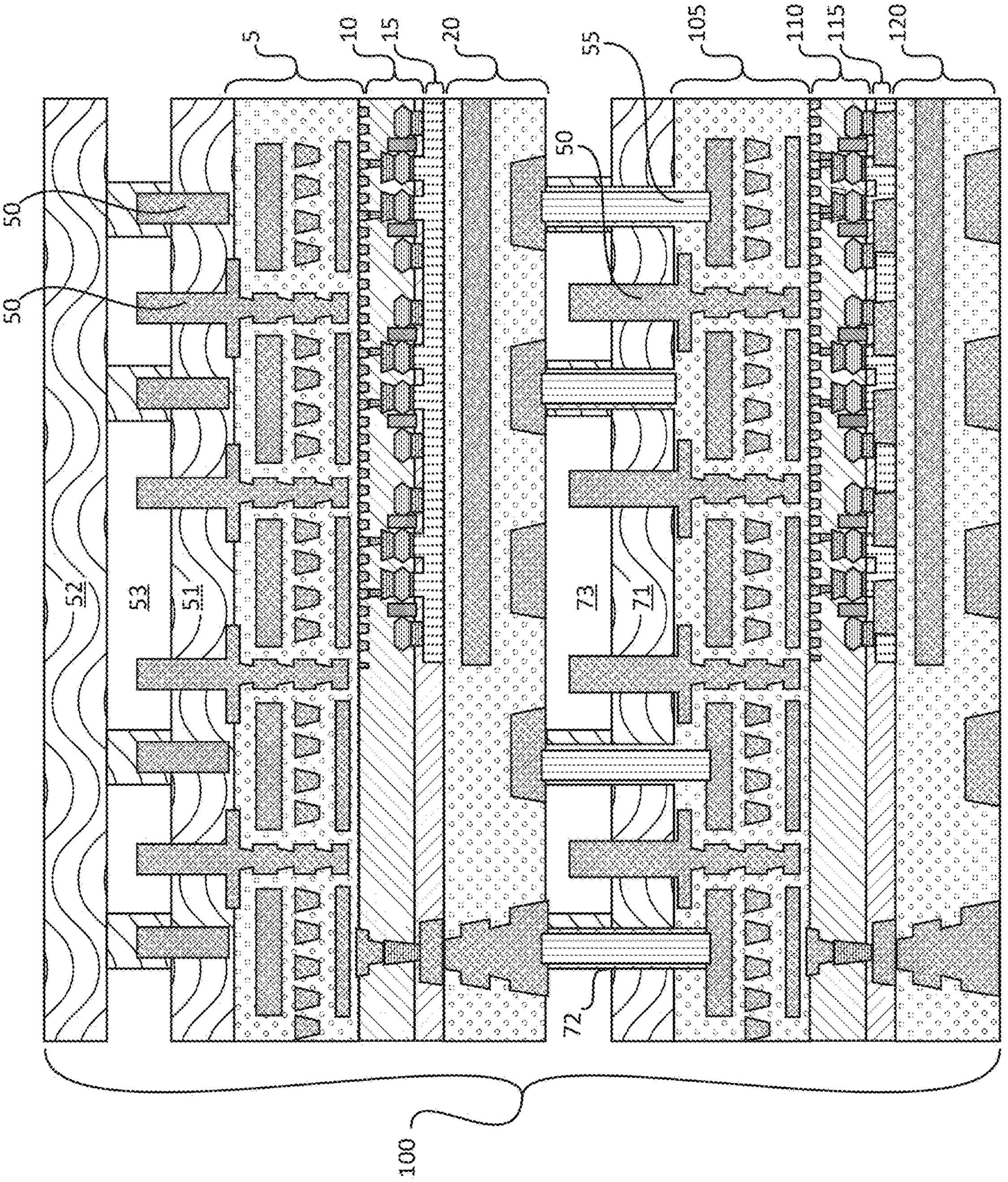
FIG. 1 is a side cross-sectional view of an electrical device that includes a top die level including first thermal cooling through silicon vias (TSV) and microchannels, and a second die level including second thermal cooling through silicon vias (TSV) and electrical connection through silicon vias, wherein an active device layer is in a level of the electrical device that is separate from a level containing the through silicon vias (TSV), in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms “upper”, “lower”, “right”, “left”, “vertical”, “horizontal”, “top”, “bottom”, and derivatives thereof shall relate to the embodiments of the disclosure, as it is oriented in the drawing figures. The term “positioned on” means that a first element, such as a first structure, is present on a second element, such as a second structure, wherein intervening elements, such as an interface structure, e.g. interface layer, may be present between the first element and the second element. The term “direct contact” means that a first element, such as a first structure, and a second element, such as a second structure, are connected without any intermediary conducting, insulating or semiconductor layers at the interface of the two elements.

In thermal cooling of through silica via (TSV) structures it has been determined that when the active device and the through silica via (TSV) structures are on the same substrate there can be a variety of problems. For example, prior TSV structures suffer from low efficiency and also can result in space conflicts between micro channels and through silicon vias being integrated into the same substrate. The structures provided herein include embedded through silica via (TSV) structures and micro channels in a front side silicon carrier for use in cooling for back-side power distribution network containing devices, in which the active devices and through silicon vias are on different substrates, e.g., are in different material layers of the structure.

More particularly, the active device of the structure including the cooling for back side power distribution networks having embedded through silicon vias and microchannels in the front side of the silica carrier are based upon, i.e., produced on, the silicon on oxide (SOI) substrate. The term “active device” refers to a devices that include, but are not limited to transistors, resistors and capacitors. The term “active device layer” refers to a wafer, die, or substrate of any size which includes electronic circuit elements such as but not limited to transistors, resistors and capacitors.

This is a separate layer in the final device structure that includes the through silica vias (TSV). As noted, the structure includes cooling for back side power distribution networks having embedded through silicon vias (TSV) and micro-channels in the front side of the silica carrier. To provide this, the active devices are first formed on the semiconductor on insulator (SOI) layer of an SOI substrate. Following formation of the active devices, as well as other process steps, such as metal wiring, e.g., back end of the line (BEOL) processing, the structure may be bonded to a carrier wafer. The through silicon vias (TSV) can be partially embedded in the carrier wafer, and bonding of the carrier wafer to the structure including the active devise can result in the formation of microchannels. This provides that the through silicon vias are in separate layers than the active devices. Thereafter, the bulk substrate of the SOI substrate is removed to expose the backside surface for processing in providing the back side power distribution network. This provides that the level of the device including the active devices is separate from the level of the device including the through silica vias (TSV), which solves the problems of the previous designs in which the through silica vias (TSV) compete for space with the active devices.

The methods and structures of the present disclosure are now discussed with more detail referring to FIGS. 1-6.

FIG. 1 is a side cross-sectional view of an electrical device that includes a top die level including first thermal cooling through silicon vias (TSV) 50 and microchannels 53, and a second die level including second thermal cooling through silicon vias (TSV) 51 and electrical connection through silicon vias (TSV) 55, wherein an active device layer 10 is in a level of the electrical device that is separate from a level containing the through silicon vias (TSV) 50, 55. The through silicon vias (TSV) are embedded in a semiconductor containing layer 51, 71. More particularly, first thermal cooling through silicon vias 50 are present in a first semiconductor containing layer 51 of the first die, and both second thermal cooling through silicon vias 50 and electrical connection through silicon vias 71 are present in a second semiconductor containing layer 71 of the second die.

The term "through silicon via (TSV)" is a vertical metal containing (via) passing completely through a silicon wafer, substrate or die. As used herein, the term "through silicon via" is not intended to only be limited to silicon containing structures, as any substrate through which a via extends is suitable for providing a TSVs, including any composition of the substrate. For example, in addition to silicon containing substrates, such as silicon (Si), silicon germanium (SiGe), silicon doped with carbon (Si: C), and silicon carbide (SiC), TSV structures may be formed through other semiconductor substrates, such as other type IV semiconductors, such as germanium (Ge), and compound semiconductors, such as type III-V semiconductors, e.g., gallium arsenide (GaAs) containing semiconductor substrates.

The metal of the through silicon via 50, 55 may be any elemental metal, such as copper (Cu), aluminum (Al), titanium (Ti), tantalum (Ta), tungsten (W) and combinations thereof.

As noted, the through silicon vias (TSV) 50, 55 are embedded in a semiconductor containing layer 51. This layer may be a component of a carrier wafer that is used in processing the device for providing back side interconnects, and/or a back side power distribution network. Although the term "semiconductor-containing" is intended to denote any semiconductor material, such as type IV semiconductor and type III-V semiconductors. For example, the semiconductor containing layer 51 may be composed of silicon. This is just one example, and it is not intended that the semiconductor containing layer 51 be limited to only silicon compositions. For example, in addition to silicon, the semiconductor containing layer may be, silicon germanium (SiGe), silicon doped with carbon (Si: C), and silicon carbide (SiC), germanium (Ge), and compound semiconductors, such as type III-V semiconductors, e.g., gallium arsenide (GaAs) containing semiconductor substrates.

The through silicon vias (TSV) may be an electrical connection through silicon via (TSV) 55 or a thermal cooling through silicon via (TSV) 50.

Electrical connection through-silicon vias (TSV) or through-chip via is a vertical electrical connection (via) that passes completely through a semiconductor level, silicon wafer or die. In the embodiment depicted in FIG. 1, the electrical connection through-silicon via (TSV) is identified by reference number 55 and is present between a top die and a second die through a channel level 53, i.e., a channel level for the transport of cooling liquid, e.g., coolant. The electrical connection through silicon vias may include an electrically conductive core, e.g., a metal core, with a dielectric sidewall liner, e.g., oxide, such as silicon oxide or silicon nitride. In some embodiments, the electrically conductive material core is typically comprised of a metal including, but not limited to W, Ni, Ti, Mo, Ta, Cu, Pt, Ag, Au, Ru, Ir, Rh, and Re, and alloys that include at least one of the aforementioned conductive elemental metals. In other embodiments, the electrically conductive material core may include a doped semiconductor material, such as a doped silicon containing material, e.g., doped polysilicon. The dielectric sidewall liner protects the electrically conductive core of the electrical connection through-silicon vias (TSV) 55 from interacting, e.g., shorting with, the semiconductor materials that the electrical connection through-silicon vias (TSV) pass through.

Thermal cooling through silicon vias (TSV) are identified by reference number 50. The generation of heat within a confined region inherently gives rise to temperature elevation, and can thereby cause potential performance degradation and, in severe instances, physical harm to a circuit. Thermal cooling through silicon vias (TSV) 50 may be provided by thermally conductive pillars that are utilized to dissipate heat from the stacked electrical structures provided herein. Their role is comparable to that of through-silicon vias (TSVs). Thermally conductive pillars mitigate the effects of heat on 3D ICs. Thermal conductive pillars are vertical interconnects that traverse at least a portion of a thickness of a 3D IC. These pillars are responsible for dissipating heat from the IC's, which is essential for maintaining optimal operating temperatures. For example, copper containing thermally conductive pillars used for thermal cooling through silicon vias can dissipate heat, in which this phenomenon is attributed to the preferential heat transfer through a Cu TSV in the vertical direction caused by the high thermal conductivity of Cu. Copper TSVs are a solution for thermal management in 3D-ICs due to their excellent thermal conductivity properties. By providing an efficient vertical heat dissipation pathway, they can significantly reduce the temperature gradients within stacked ICs, leading to improved performance and reliability.

It is noted that although not depicted in the supplied figures, the thermal cooling through silicon vias (TSV) 50 can further include a liner. For example, if the thermal cooling through silicon vias (TSV) 50 have a core material of copper, and if the design is employing a water based coolant for cooling, the coolant can corrode an exposed Cu via. Therefore, a liner may be integrated to protect a core material from potential corrosion. IN some examples, the liner may be a dielectric, such as silicon nitride, silicon oxide, or any other suitable dielectric material, or combination thereof. The thickness of the liner may be selected to provide for corrosion protection while still maintaining thermal transports. For some dielectric liner materials, the liner for the thermal cooling through silicon vias (TSV) 50 can be much thinner than a liner that is present in the electrical connection through silicon vias 55. It is not required that the material of the liner be a dielectric. For example, in some embodiments, the corrosion protection liner may be composed of a metal. If it is only a metal liner, the composition could be any suitable BEOL metal. Examples may include TaN, TiN, Co, Ti, Ru and combinations thereof.

In some embodiments, the thermal cooling through silicon vias (TSV) 50 can be optionally connected to the ground layers in the back end of the line (BEOL) level 5, and may be even the power layers. For example, if there is either dielectric fluid or a thinner dielectric liner on the cooling vias to prevent shorts.

The active device layer 10 may include a plurality of semiconductor devices present thereon. In some embodiments, as used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. The semiconductor devices may be switching devices, logic devices, and memory devices. Examples of switching devices and/or logic devices suitable for use with the present disclosure include p-n junction devices, bipolar junction transistors (BJT), field effect transistors, fin field effect transistors (FinFETS), Schottky barrier transistors, nanowire/nano-channel transistors and combinations thereof. As used herein, a "field effect transistor" is a transistor in which output current, i.e., source-drain current, is controlled by the voltage applied to the gate. A field effect transistor has three terminals, i.e., gate, source and drain. A "FinFET" is a semiconductor device, in which the channel of the device is present in a fin structure. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure.

The active device layer 10, 110 may also include memory devices. As used herein, the term "memory device" means a structure in which the electrical state can be altered and then retained in the altered state, in this way a bit of information can be stored. The memory device may be volatile or non-volatile. Examples of memory devices suitable for use on the active device wafer include random access memory (RAM), dynamic random access memory (DRAM), embedded dynamic random access memory (EDRAM), phase change material (PCM) memory structures, FLASH memory, molecular memory and combinations thereof.

The active device layer 10, 110 may also include passive electrical devices, such as capacitors and resistors. The active device layer 10, 110 may also include middle of the line contacts 15, 115. As will be explained below the number of active device layers 10 may vary in the following examples, however the active device layer is separate from the layers including the through silicon vias (TSV), e.g., the electrical connection through silicon vias 55, and the thermal cooling through silicon vias (TSV) 50.

Referring to FIG. 1, in one embodiment, an electrical device 100 is provided that includes a top die level including first thermal cooling through silicon vias (TSV) 50 and microchannels 53, and a second die level including second thermal cooling through silicon vias (TSV) 50 and electrical connection through silicon vias 55, wherein an active device layer 10 is in a level of the electrical device that is separate from a level containing the first thermal cooling through silicon vias (TSV), the second thermal cooling through silicon vias and the electrical connection through silicon vias (TSV).

The microchannels 53 are for coolant passages for coolant flow, thereby allowing coolant to come into contact with the thermal cooling through silicon vias (TSV) 50.

In one embodiment, the first die level includes a first semiconductor containing layer 51 having the first thermal cooling through silicon vias (TSV) 50 embedded therein. The first semiconductor containing layer 51 that is depicted in the embodiment illustrated in FIGS. 1 and 2 does not include electrical connection through silicon vias (TSV) 55, which in this embodiment are exclusively present in the second semiconductor containing layer 71 of the second die.

The first die level also includes metal wiring in a first back end of the line (BEOL) level 5 that is in contact with the first thermal cooling through silicon vias (TSV) 50 that are embedded in the first silicon containing layer 51. The first back end of the line (BEOL) level 5 may be a multilayered level of dielectric interlevel dielectrics having metal lines for horizontal electrical communication and metal vias for vertical electrical communication present therein. The first back end of the line (BEOL) level 5 is positioned between a first active device layer 10 and the first semiconductor containing layer 51 having the first thermal cooling through silicon vias (TSV) 50 present therein. The first active device layer 10 is also present on a first back side interconnect 20. The back side interconnect 20 may be a component of a back side power distribution network.

In some embodiments, the first die level and the second die level are separated by a fluidic channel level 73, wherein the electrical connection through silicon vias (TSV) 55 extend through the fluidic channel level 73 to transmit electrical current between the first and second die level. In the embodiment that is depicted in FIG. 1, support between the first die and the second die may be provided by semiconductor pillars 72. The electrical connection through silicon vias (TSV) 55 extend through the semiconductor pillars 72. The semiconductor pillars 72 can separate the electrical connection through silicon vias (TSV) 55 from coolant that can pass through the channels having reference number 53.

The second die level can include a second semiconductor containing layer 71 having the second thermal cooling through silicon vias (TSV) 50 and the electrical connection through silicon vias (TSV) 55 embedded therein. Different than the electrical connection through silicon vias (TSV) 55, the second thermal cooling through silicon vias (TSV) 50 are not encased in dielectric or semiconductor material. This can provide that the thermal cooling through silicon vias (TSV) 50 directly contact coolant that passes through the fluidic channel level 73.

The second die level includes a second active device layer 110. The second active device layer 110 is similar to the first active device layer 10 that has been described above. Therefore, the above description of the first active device layer 10 may provide at least one embodiment for the second active device layer 110 that is depicted in FIG. 1. The second active device layer 110 is separated from the second semiconductor containing layer 71 by a second back end of the line (BEOL) level 105. The second thermal cooling through silicon vias (TSV) 50 and the electrical connection through silicon vias (TSV) 55 extend into the second back end of the line (BEOL) level 105. The second active device layer 110 is present on a second back side interconnect 120. The second back side interconnect 120 is similar to the first back side interconnect 20 that has been described above. Therefore, the above description of the first back side interconnect 20 may provide at least one embodiment for the second back side interconnect 120 that is depicted in FIG. 1.

Figure 2:
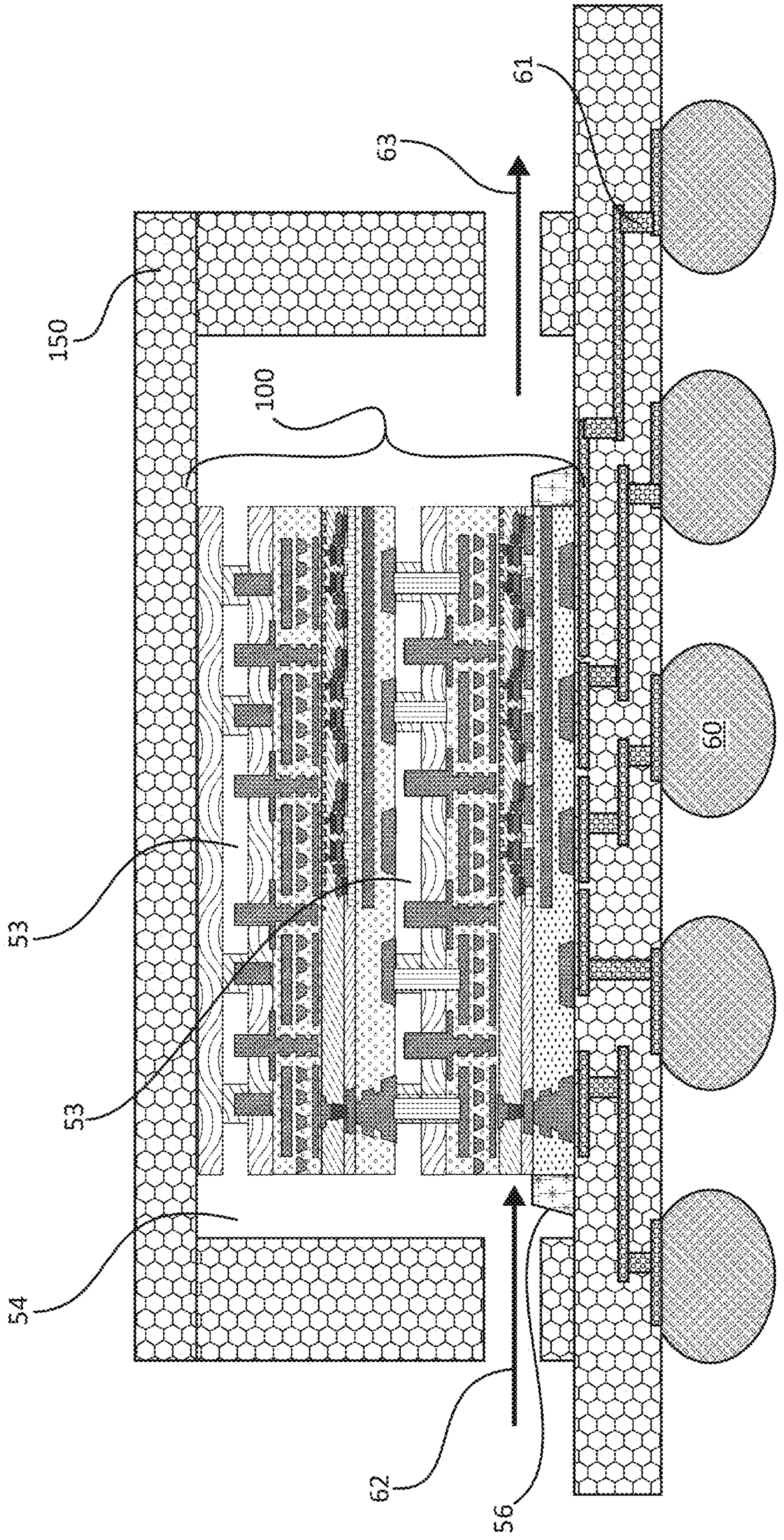
FIG. 2 is a side cross-sectional view of final packaging the electrical device depicted in FIG. 1 to provide for coolant flow through the device, in accordance with one embodiment of the present disclosure.

FIG. 2 is a side cross-sectional view of final packaging 150 the electrical device 100 depicted in FIG. 1 to provide for coolant flow 62, 63 through the device 100, e.g., through channels 53, 73 of the device 100, in accordance with one embodiment of the present disclosure.

The coolant may be water based. The coolant may be a non-dielectric coolant. Non-dielectric coolants typically have a thermal conductivity of 0.3 $W \cdot m^{-1} \cdot K^{-1}$ or greater. Examples of non-dielectric coolants include Ethylene Glycol (EG), Propylene Glycol (PG), Methanol/Water, Ethanol/Water, Calcium Chloride Solution, Potassium Formate/Acetate Solution, Liquid Metals, e.g., liquid metals of Ga—In—Sn chemistry, and combinations thereof. In the embodiments, in which dielectric coolants are employed within the coolant passages 110 the seal structures 120 may be omitted. Dielectric coolants generally have a thermal conductivity of less than 0.3 $W \cdot m^{-1} \cdot K^{-1}$. Dielectric coolants that may be used within the coolant passages 110 include aromatics, such as synthetic hydrocarbons of aromatic chemistry, e.g., diethyl benzene [DEB], dibenzyl toluene, diaryl alkyl, partially hydrogenated terphenyl; silicate-esters, such as Coolanol 25R; aliphatics, such as aliphatic hydrocarbons of paraffinic and iso-paraffinic type (including mineral oils), e.g., aliphatic chemistry (polyalphaolefins or PAO); silicones, such as dimethyl- and methyl phenyl-poly (siloxane); fluorocarbons, such as fluorinated compounds, e.g., perfluorocarbons (i.e., FC-72, FC-77) hydrofluoroethers (HFE) and perfluorocarbon ethers (PFE); and combinations thereof.

Still referring to FIG. 2, the final packaging 150 may include electrical pathways 61 to ball metallurgy 60, e.g., for solder bonding. The electrical pathways 61 may be in electrical communication with the electrically conductive features of the back side interconnect 120. An underfill 56 is also present to secure the electrical device 100 to the final packing 150.

Figure 3:
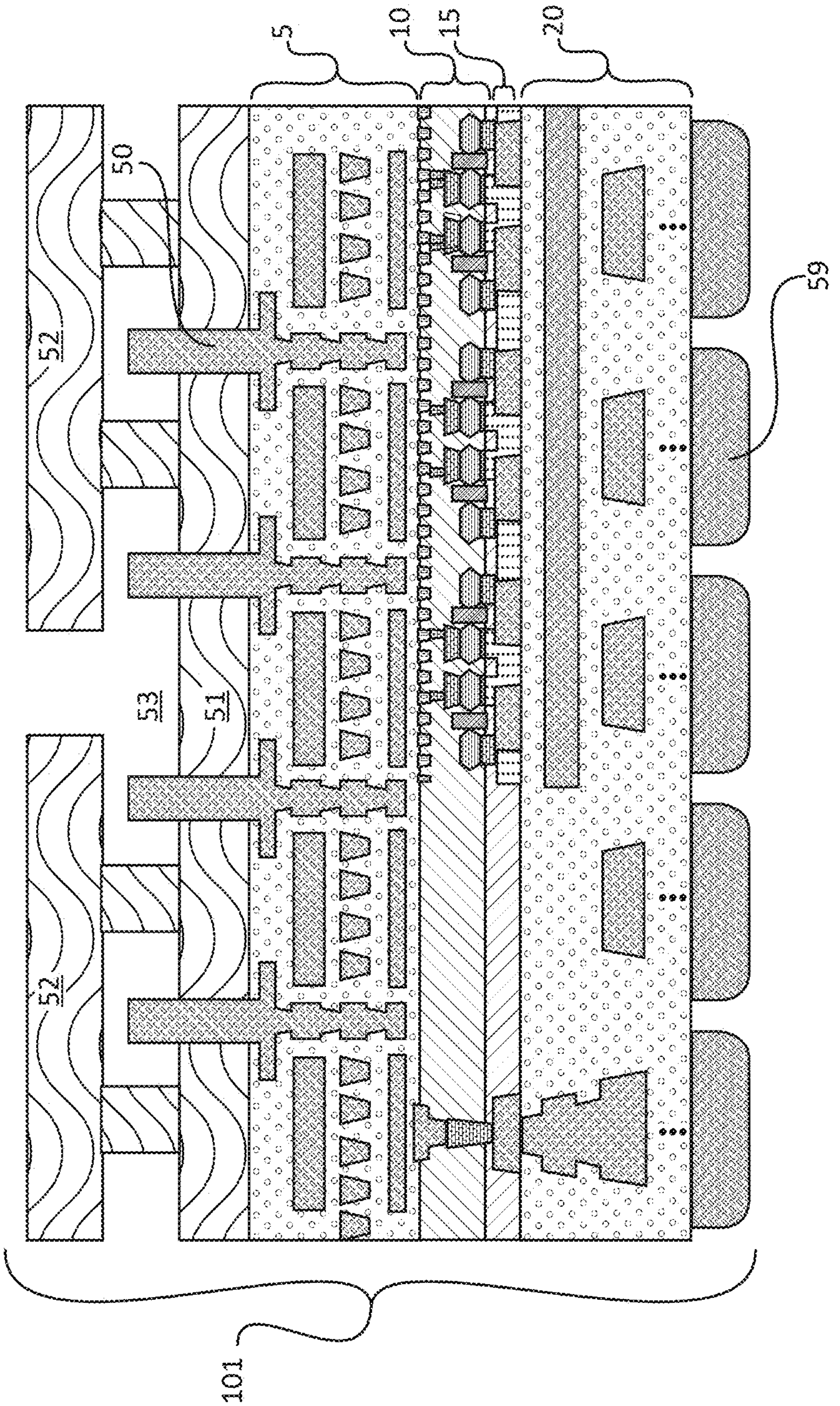
FIG. 3 is a side cross-sectional view of an electrical device that includes a fluidic channel level including thermal cooling through silicon vias (TSV) embedded through a semiconductor containing layer, wherein a cap layer for the fluidic channel level includes an opening therethrough to channels containing the thermal cooling through silicon vias (TSV), in accordance with one embodiment of the present disclosure.

FIG. 3 is a side cross-sectional view of an electrical device 101 that includes a fluidic channel level including thermal cooling through silicon vias (TSV) 50 embedded through a semiconductor containing layer 51, wherein a cap layer 52 for the fluidic channel level includes an opening therethrough to channels 53 containing the thermal cooling through silicon vias (TSV) 50, in accordance with one embodiment of the present disclosure. Different from the embodiment that is depicted in FIGS. 1 and 2, the embodiment that is depicted FIG. 3 does not include two dies, and in some embodiments can only include a single active device layer 10.

The active device layer 10 is in a level of the electrical device that is separate from a level containing the thermal cooling through silicon vias (TSV) 50. The active device layer 10 that is depicted in FIG. 3 is similar to the active device layer 10 that has been described above with reference to FIG. 1. Therefore, the above description of the active device layer 10 depicted in FIG. 1 may provide at least one embodiment for the active device layer 10 that is depicted in FIG. 3.

The electrical device 101 depicted in FIG. 3 can further include back end of the line (BEOL) level 5 that is in contact with the thermal cooling through silicon vias (TSV) 50 that are embedded in the semiconductor containing layer 51. The back end of the line (BEOL) level 5 depicted in FIG. 3 is similar to the back end of the line level 5 that has been described above with reference to FIG. 1. Therefore, the above description of the back end of the line level 5 that is depicted in FIG. 1 may provide at least one embodiment for the back end of the line level 5 that is depicted in FIG. 3. The back end of the line (BEOL) level 5 can be positioned between the at least one active device layer 10 and the semiconductor containing layer 51 having the thermal cooling through silicon vias (TSV) 55 present therein.

The at least one active device layer 5 is present on a back side interconnect. The back side interconnect 20 depicted in FIG. 3 is similar to the back side interconnect 20 that has been described above with reference to FIG. 1. Therefore, the above description of the back side interconnect 20 depicted in FIG. 1 may provide at least one embodiment for the back side interconnect 20 that is depicted in FIG. 3.

Figure 4:
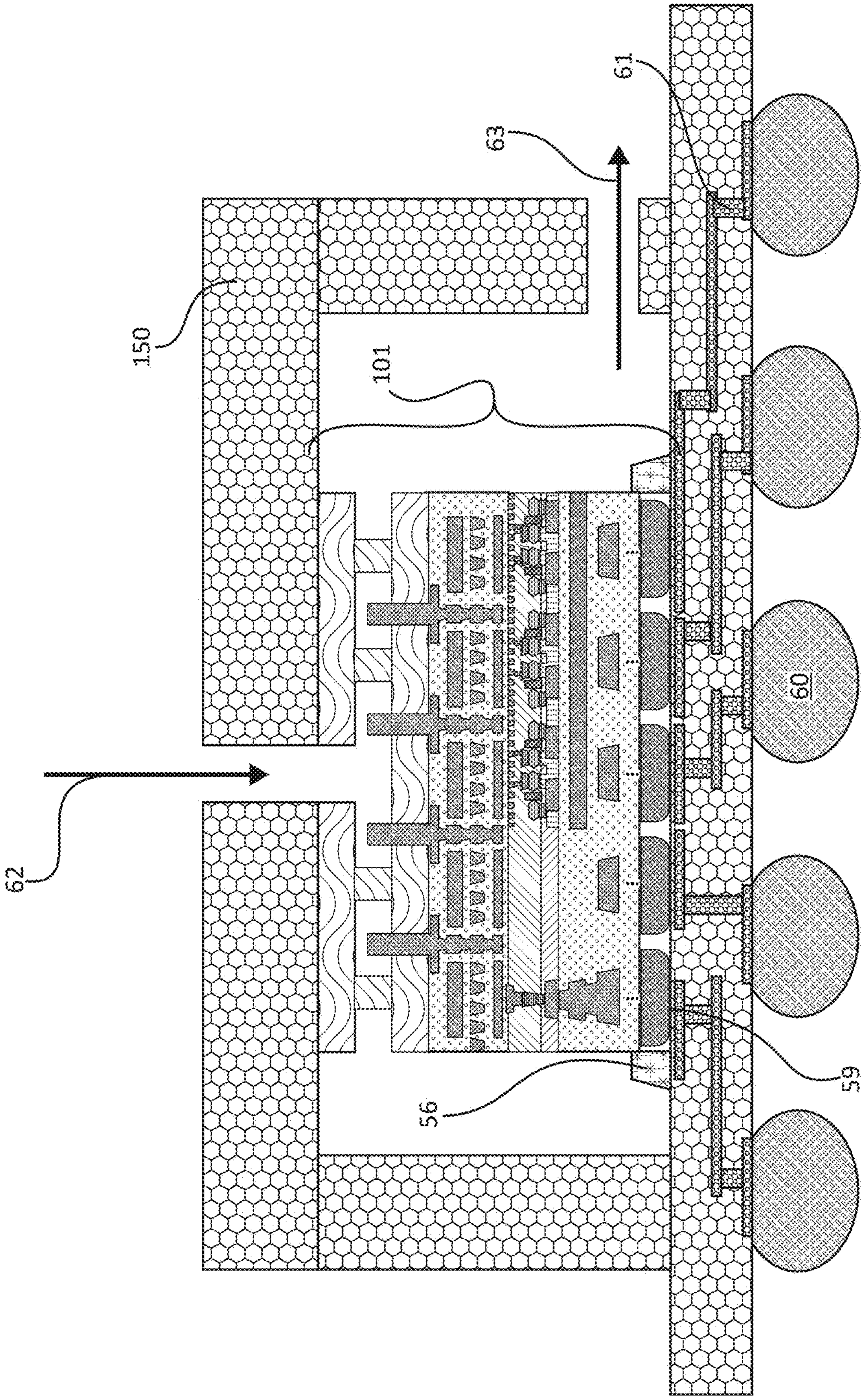
FIG. 4 is a side cross-sectional view of final packaging the electrical device depicted in FIG. 3 to provide for coolant flow through the device, in accordance with one embodiment of the present disclosure.

FIG. 4 is a side cross-sectional view of final packaging 151 the electrical device 101 depicted in FIG. 3 to provide for coolant flow 62, 63 through the device 101, in accordance with one embodiment of the present disclosure. The final packaging 151 depicted in FIG. 4 is similar to the final packaging 150 depicted in FIG. 2. One exception is that in the final packaging 151 depicted in FIG. 4, the coolant entry point 62 is present through an opening in a cap layer 52 for the electrical device 101, that leads to fluidic channel 53 within the electrical device 101. The coolant may be water based. The coolant may be a non-dielectric coolant. Further descriptions for the coolant have been provided above with reference to FIG. 2.

Still referring to FIG. 3, the final packaging 151 may include electrical pathways 61 to ball metallurgy 60, e.g., for solder bonding. The electrical pathways 61 may be in electrical communication with the electrically conductive features of the back side interconnect 120. An underfill 56 is also present to secure the electrical device 100 to the final packing 150.

Figure 5:
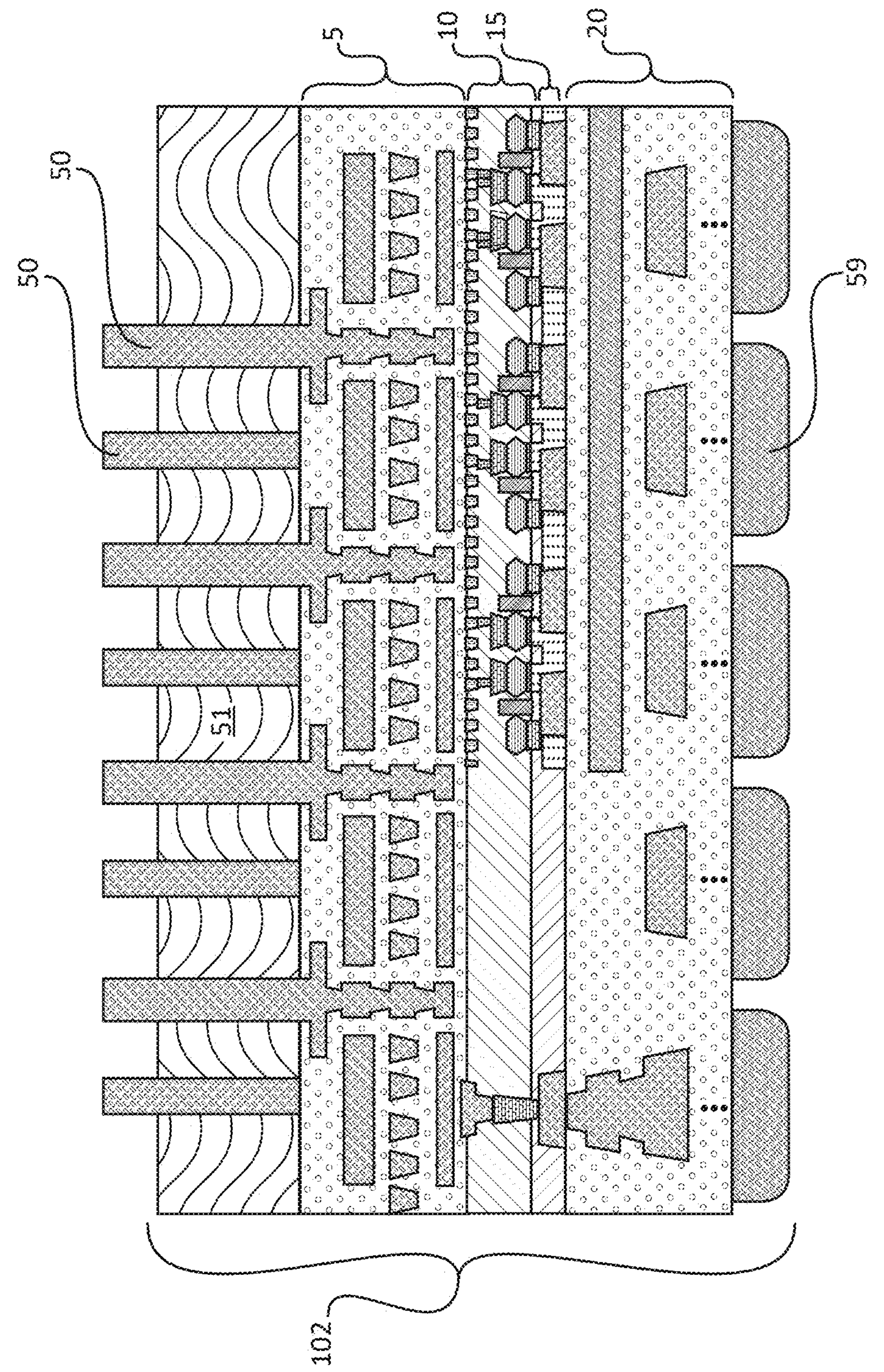
FIG. 5 is a side cross-sectional view of an electrical device that includes thermal cooling through silicon vias (TSV) embedded through a semiconductor containing layer, wherein the semiconductor containing layer is at one end of a stacked structure providing the electrical device, wherein the thermal cooling through silicon vias (TSV) have a face that is coplanar with a face of the semiconductor containing layer, in accordance with one embodiment of the present disclosure.

FIG. 5 is a side cross-sectional view of an electrical device 102 that includes thermal cooling through silicon vias (TSV) 50 embedded through a semiconductor containing layer 51, wherein the semiconductor containing layer 51 is at one end of a stacked structure providing the electrical device 100. In the embodiment that is depicted in FIG. 5, the thermal cooling through silicon vias (TSV) 50 have a face F1 that is coplanar with a face F2 of the semiconductor containing layer 51, in accordance with one embodiment of the present disclosure.

The electrical device may also include at least one active device layer 10 in the stacked structure that is present a level of the electrical device 101 that is separate from a level containing the thermal cooling through silicon vias (TSV) 50.

In this embodiment, the stacked structure does not need well isolation for fluidic channels.

In some embodiments, the electrical device 101 further includes a back end of the line (BEOL) level 20 that is in contact with the thermal cooling through silicon vias (TSV) 50 that are embedded in the semiconductor containing layer 51. The back end of the line (BEOL) level 20 is positioned between the at least one active device layer 10 and the semiconductor containing layer 51 having the thermal cooling through silicon vias (TSV) 50 present therein. The at least one active device layer 10 can be present on a back side interconnect 120.

Figure 6:
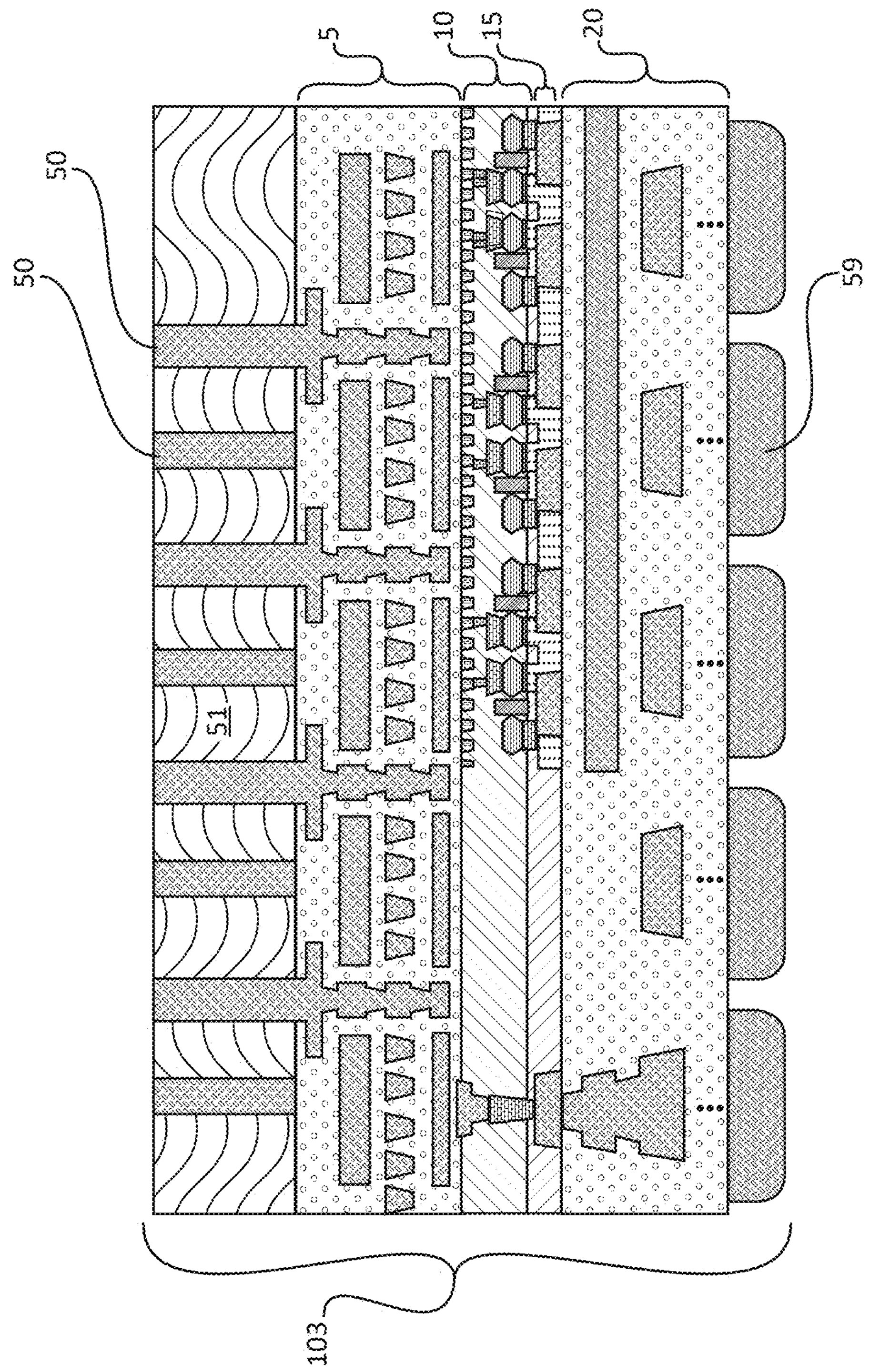
FIG. 6 is a side cross-sectional view of an electrical device is provided that includes thermal cooling through silicon vias (TSV) embedded through a silicon-containing layer, wherein the semiconductor containing layer is at one end of a stacked structure providing the electrical device, wherein the thermal cooling through silicon vias (TSV) have a face that protrudes beyond a face of the semiconductor containing layer, in accordance with one embodiment of the present disclosure.

FIG. 6 is a side cross-sectional view of an electrical device is provided that includes thermal cooling through silicon vias (TSV) embedded through a silicon-containing layer, wherein the silicon-containing layer is at one end of a stacked structure providing the electrical device, wherein the thermal cooling through silicon vias (TSV) have a face 51 that protrudes beyond a face F2 of the semiconductor containing layer, in accordance with one embodiment of the present disclosure.

The electrical device may also include at least one active device layer 10 in the stacked structure that is present a level of the electrical device 101 that is separate from a level containing the thermal cooling through silicon vias (TSV) 50.

In this embodiment, the stacked structure does not need well isolation for fluidic channels.

In some embodiments, the electrical device 101 further includes a back end of the line (BEOL) level 20 that is in contact with the thermal cooling through silicon vias (TSV) 50 that are embedded in the semiconductor containing layer 51. The back end of the line (BEOL) level 20 is positioned between the at least one active device layer 10 and the semiconductor containing layer 51 having the thermal cooling through silicon vias (TSV) 50 present therein. The at least one active device layer 10 can be present on a back side interconnect 120.

In this embodiment, the stacked structure does not need well isolation for fluidic channels.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

The invention claimed is:

1. An electrical device comprising:

a first die level including first thermal cooling through silicon vias (TSV) in contact with fluidic channels; and a second die level including second thermal cooling TSV and electrical connection TSV, wherein at least one active device layer is in a level of the electrical device that is separate from a level containing the first thermal cooling TSV, the second thermal cooling TSV and the electrical connection TSV.

2. The electrical device of claim 1, wherein the first die level includes a first silicon containing layer having the first thermal cooling TSV embedded therein.

3. The electrical device of claim 2, wherein the first die level includes metal wiring in a first back end of the line (BEOL) level that is in contact with the first thermal cooling TSV that are embedded in the first silicon containing layer.

4. The electrical device of claim 3, wherein the first BEOL level is positioned between a first active device layer of the at least one active device layer and the first silicon containing layer having the first thermal cooling TSV present therein.

5. The electrical device of claim 4, wherein the first active device layer is present on a first back side interconnect.

6. The electrical device of claim 1, wherein the first die level and the second die level are separated by a fluidic channel level, wherein the electrical connection TSV extend through the fluidic channel level to transmit electrical current between the first and second die level.

7. The electrical device of claim 1, wherein the second die level includes a second silicon containing layer having the second thermal cooling TSV and the electrical connection TSV embedded therein.

8. The electrical device of claim 7, wherein the second die level includes a second active device layer.

9. The electrical device of claim 8, wherein the second active device layer is separated from the second silicon containing layer by a second back end of the line (BEOL) level, the second thermal cooling TSV and the electrical connection TSV extending into the second BEOL level.

10. The electrical device of claim 8, wherein the second active device layer is present on a second back side interconnect.

11. An electrical device comprising:

a fluidic channel level including thermal cooling through silicon vias (TSV) embedded through a silicon-containing layer, wherein a cap layer for the fluidic channel level includes an opening therethrough to channels containing the thermal cooling TSV; and at least one active device layer is in a level of the electrical device that is separate from a level containing the thermal cooling TSV.

12. The electrical device of claim 11, further comprising a back end of the line (BEOL) level that is in contact with the thermal cooling TSV that are embedded in the silicon-containing layer.

13. The electrical device of claim 12, wherein the BEOL level is positioned between the at least one active device layer and the silicon-containing layer having the thermal cooling TSV present therein.

14. The electrical device of claim 13, wherein the at least one active device layer is present on a back side interconnect.

15. An electrical device comprising:

thermal cooling through silicon vias (TSV) embedded through a silicon-containing layer and in contact with fluidic channels, wherein the silicon-containing layer is at one end of a stacked structure providing the electrical device; and at least one active device layer in the stacked structure that is present in a level of the electrical device that is separate from a level containing the thermal cooling TSV.

16. The electrical device of claim 15, wherein the thermal cooling TSV have a face that is coplanar with a face of the silicon-containing layer.

17. The electrical device of claim 15, wherein the thermal cooling TSV have a face that protrudes beyond a face of the silicon-containing layer.

18. The electrical device of claim 15, further comprising a back end of the line (BEOL) level that is in contact with the thermal cooling TSV that are embedded in the silicon containing silicon-containing layer, wherein the BEOL level is positioned between the at least one active device layer and the silicon-containing layer having the thermal cooling TSV present therein.

19. The electrical device of claim 18, wherein the at least one active device layer is present on a back side interconnect.

20. The electrical device of claim 15, wherein the stacked structure does not include well isolation for the fluidic channels.

* * * * *